United States Patent
Nurminen et al.

(10) Patent No.: US 8,982,653 B2
(45) Date of Patent: Mar. 17, 2015

(54) METHOD AND DEVICE FOR TEMPERATURE-BASED DATA REFRESH IN NON-VOLATILE MEMORIES

(75) Inventors: Janne Tapani Nurminen, Oulunsalo (FI); Kimmo Juhani Mylly, Ylojarvi (FI); Matti Kalevi Floman, Kangasala (FI)

(73) Assignee: Memory Technologies LLC, Las Vegas, NV (US)

( * ) Notice: Subject to any disclaimer, the term of this patent is extended or adjusted under 35 U.S.C. 154(b) by 221 days.

(21) Appl. No.: 13/128,812

(22) PCT Filed: Nov. 11, 2008

(86) PCT No.: PCT/EP2008/009511
§ 371 (c)(1),
(2), (4) Date: May 11, 2011

(87) PCT Pub. No.: WO2010/054670
PCT Pub. Date: May 20, 2010

(65) Prior Publication Data
US 2011/0219203 A1    Sep. 8, 2011

(51) Int. Cl.
G11C 7/04 (2006.01)
G11C 13/00 (2006.01)
G11C 11/406 (2006.01)
G11C 16/34 (2006.01)

(52) U.S. Cl.
CPC ............ *G11C 13/0069* (2013.01); *G11C 7/04* (2013.01); *G11C 11/406* (2013.01); *G11C 11/40626* (2013.01); *G11C 13/0033* (2013.01); *G11C 13/0035* (2013.01); *G11C 16/3431* (2013.01); *G11C 16/349* (2013.01)

USPC .......................................... 365/211; 365/222

(58) Field of Classification Search
USPC ......................................... 365/222, 211, 212
See application file for complete search history.

(56) References Cited

U.S. PATENT DOCUMENTS

| | | | |
|---|---|---|---|
| 6,373,768 B2 * | 4/2002 | Woo et al. ...................... | 365/211 |
| 6,522,586 B2 * | 2/2003 | Wong ....................... | 365/185.25 |
| 7,035,157 B2 | 4/2006 | Chang | |
| 7,196,956 B2 | 3/2007 | Shirota et al. | |
| 7,233,538 B1 * | 6/2007 | Wu et al. ........................ | 365/222 |
| 7,292,488 B2 | 11/2007 | Hokenmaier et al. | |
| 7,395,176 B2 * | 7/2008 | Chung et al. ................... | 702/132 |
| 7,450,456 B2 * | 11/2008 | Jain et al. ....................... | 365/212 |
| 7,760,569 B2 * | 7/2010 | Ruf et al. ....................... | 365/211 |
| 7,852,582 B2 | 12/2010 | Ermolov et al. | |

(Continued)

FOREIGN PATENT DOCUMENTS

| | | | |
|---|---|---|---|
| EP | 1858021 A2 | 11/2007 | |
| EP | 1933327 A2 | 6/2008 | |

OTHER PUBLICATIONS

International Search Report and Written Opinion received for corresponding Patent Cooperation Treaty Application No. PCT/EP2008/009511, dated Nov. 18, 2009; 21 pages.

*Primary Examiner* — Kretelia Graham
(74) *Attorney, Agent, or Firm* — Lee & Hayes, PLLC

(57) ABSTRACT

The invention relates to a method comprising measuring the temperature of at least one location of a non-volatile memory; determining if said temperature measurement indicates that the data retention time of data stored at said at least one location is reduced below a threshold; and re-writing said data to said non-volatile memory in response to a positive determination.

19 Claims, 7 Drawing Sheets

(56) References Cited

U.S. PATENT DOCUMENTS

| | | | |
|---|---|---|---|
| 8,218,137 B2 * | 7/2012 | Noh et al. | 356/222 |
| 2002/0149986 A1 | 10/2002 | Wong | |
| 2006/0041729 A1 | 2/2006 | Rider et al. | |
| 2007/0211548 A1 | 9/2007 | Jain et al. | |
| 2007/0268766 A1 | 11/2007 | Mori | |
| 2008/0170431 A1 | 7/2008 | Sheu et al. | |
| 2008/0215802 A1 | 9/2008 | Chow et al. | |
| 2008/0259708 A1 | 10/2008 | Tsukazaki et al. | |
| 2010/0106901 A1 * | 4/2010 | Higeta et al. | 711/106 |
| 2013/0215700 A1 * | 8/2013 | Shirota et al. | 365/222 |

* cited by examiner

Fig. 5
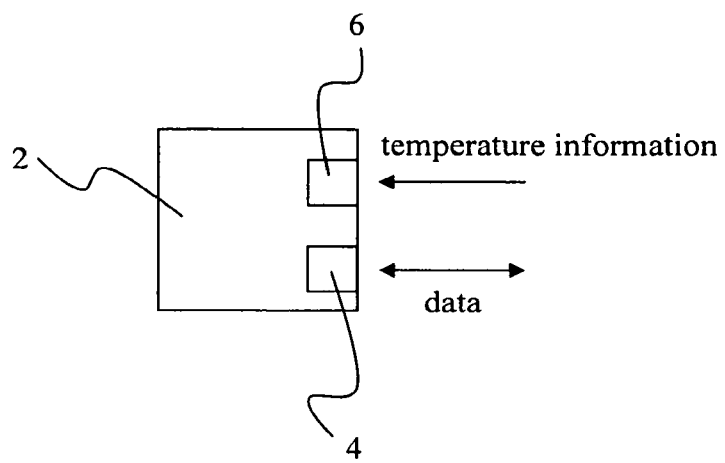
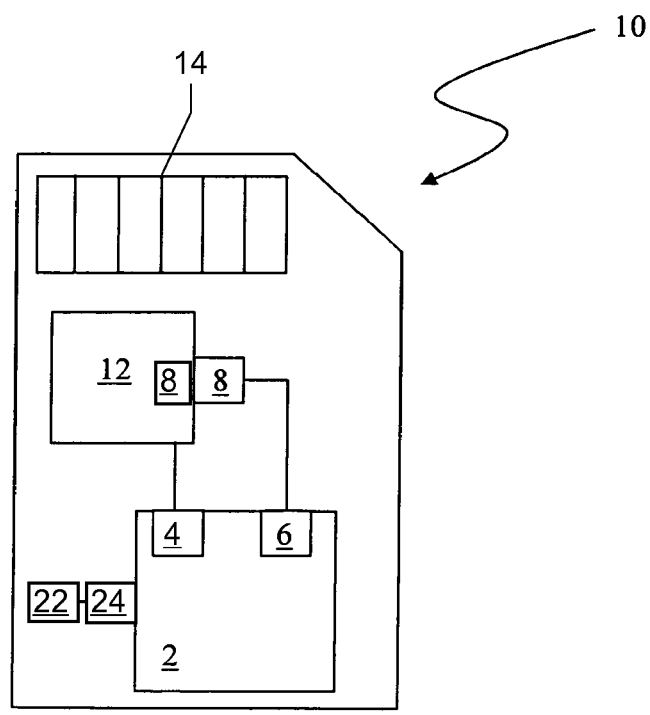
Fig. 6

METHOD AND DEVICE FOR TEMPERATURE-BASED DATA REFRESH IN NON-VOLATILE MEMORIES

RELATED APPLICATION

This application was originally filed as PCT Application No. PCT/EP2008/009511, filed Nov. 11, 2008.

The present invention relates to a method and a device for performing data refresh operations in non-volatile memories based on temperature-related conditions.

New memory components (e.g. the data retention of NAND-type memory devices) are sensitive for temperature increase. In high temperature environments such memory devices or the data stored therein, respectively, may become corrupted permanently in relatively short time. High temperatures will also decrease the amount of allowed memory program/erase (P/E) (or write/erase (W/E)) cycles over the lifetime of the memory. As the NAND process development continues to proceed towards smaller and smaller structural widths (today 56 nm, soon 43 nm and developed towards 32 nm) the reliability will become an even bigger issue. This applies to the maximum program/erase (P/E) cycle count, data retention, read/program disturbance etc. Reading an address very frequently may corrupt addresses nearby, which is referred to as read disturbance. Among these parameters especially the data retention is affected by the temperature.

Being subjected to high temperatures can occur in mobile devices, depending on the type of device, the ambient temperature, and the usage conditions.

Data corruption can be avoided by refreshing stored data. However, with common non-volatile memories, e.g. NAND-type memories, this will involve re-writing stored data to a different location inside the memory or by re-writing it to same location after an erase of the location. As the total number of writing/erasing operations before the memory will fail is usually limited for non-volatile memories, every data (re)writing/erasing operation shortens the lifetime of the memory. Thus such refreshing can only be performed at the cost of reducing the lifetime of the memory. It is therefore not possible to simply perform regular data refresh operations that are suitable for maintaining data integrity under all circumstances, as the frequency of such refreshes would severely reduce the memories lifetime.

Volatile memories like DRAM (Dynamic Random Access Memory) and the like have a practically infinite number of possible read/write (or program)/erase cycles. Such memories rely on rather frequent regular refresh cycles in order to retain data stored therein, because otherwise they lose their data content. The time between such refresh cycles is comparatively short.

In contrast non-volatile memories do not rely on frequent refresh cycles, but on the other hand they have a somehow limited write/erase (or program/erase) count. That is, each cell of a memory of this type, e.g. flash memory, only supports a finite number of write/erase operations before the cell will fail. After that, data integrity of the cell cannot be ensured anymore. This is usually referred to as wear of the memory. Worn cells can be replaced in a transparent manner by fresh or at least still intact cells, for example by the memory controller performing a corresponding re-routing operation. This is referred to as defect handling.

To make this possible non-volatile memories usually have a certain amount of surplus cells exceeding the nominal capacity of the memory. As long as there are still surplus cells left the memory is still functional, even when a certain amount of cells have already failed. The number of write/erase operations to a non-volatile memory may be within the range of some thousands cycles to some ten thousand cycles, depending on the type of memory, the amount of surplus cells and the defect handling algorithm.

In order to distribute write/erase operations as equal to all cells as possible, additionally so-called wear-levelling techniques are employed. These techniques shall ensure that the number of remaining write/erase cycles for memory cells is as equal as possible, so that re-routing to fresh auxiliary memory cells can be postponed as long as possible.

In non-volatile memories the data retention time, i.e. the time interval for which stored data will maintain its integrity, is not per se infinite. The data retention time depends, among other things, on the temperature of the memory. Higher temperatures can significantly decrease the data retention time and finally lead to data corruption because a cell cannot hold its data integrity. This will require actions to ensure data integrity in the volatile memory.

In DRAM and like memories the problem of decreasing data retention time can easily be handled by performing a data refresh cycle before the data cannot be retained anymore. The only drawback connected therewith is increased power consumption, as each refresh cycle requires electrical power. This refresh is a low-level refresh, meaning that a complete memory, e.g. DRAM module, is provided with a refresh pulse. The refresh is not data-dependent, that is, it is performed independent of the actual data content of the DRAM module, and for all cells of the DRAM module.

A similar approach would cause a problem in non-volatile memories like flash memory, because the number of write/erase cycles is more strictly limited compared to DRAM. Performing a simple temperature-dependent complete refresh would—due to the properties of non-volatile memory—require a complete reading, erasing and re-writing of the complete content. As each write/erase access and with respect to read disturbance also read access to non-volatile memory decreases the remaining access cycles this would reduce the remaining number of write/erase cycles for the memory.

Therefore, although the short time data integrity could be ensured in such a manner, the volatile memory would rather soon approach a state where the memory cells fail due to exceeding of their maximum write/erase cycles. However, long time data integrity will suffer sufficiently.

Thus the invention proposes a method of handling data integrity in non-volatile memories that can minimize or even avoid temperature-dependent degradation of the memory due to required data refresh, while at the same time maintaining data integrity as high as possible. In high temperature environments where the data corruption risk is the highest and the data retention time is the shortest the memory refresh can be performed so that the minimum amount of write/erase cycles is spent while still keeping stored data valid without high corruption risk.

According to a first aspect of the invention a method is provided, comprising
  measuring the temperature of at least one location of a non-volatile memory;
  determining if said temperature measurement indicates that the data retention time of data stored at said at least one location is reduced below a threshold; and
  re-writing said data to said non-volatile memory in response to a positive determination.

Due to the decreasing data retention time at high temperatures the data refreshing is needed to keep stored data intact. At higher temperatures the data refreshing is needed more often and the refresh rate needs to be increased. On the other hand amount of the write/erase cycles are limited over the lifetime of the memory and thus cause wear of the memory. By using the temperature based refresh of the invention all data can be kept safe. Also a longer lifetime is ensured as the data refresh is done only when needed.

It should be noted that in the context of the invention the term "measuring the temperature" is not limited to the direct measurement, e.g. at a temperature sensor, but is intended to also include obtaining an indication allowing to determine the temperature, e.g. receiving an output/temperature indication from the temperature sensor or evaluating another property of the memory that allows to determine the temperature thereof. In the same sense "temperature measurement" is intended to also include an evaluation of such a temperature indication, which could for example be understood as an indirect temperature measurement. In this manner "measurement" of a temperature is intended to include direct as well as indirect temperature measurement or determination, respectively. Depending on the hardware implementation it may also be necessary to take into account appropriate offset values for the temperature, for example if a temperature sensor is located in the close vicinity of the memory compared to the even closer location within the memory die itself.

According to an exemplary embodiment a positive determination is made if said temperature exceeds a temperature threshold $T_{thres}$ a pre-determined number of times;

said temperature exceeds a temperature threshold $T_{thres}$ a pre-determined number of times per pre-determined time interval; or if $$\sum_{1}^{n} \Delta T_n$$

exceeds a pre-determined threshold;
wherein $$\begin{cases} \Delta T_n = T_n - T_{thres} & \text{if } T_n > T_{thres}; \\ \Delta T_n = 0 & \text{if } T_n \leq T_{thres}; \end{cases} \text{ and}$$

wherein
n is an integer value indicating the number of temperature measurements;
$T_{thres}$ is a temperature threshold; and
$T_n$ is the temperature measured in the $n^{th}$ temperature measurement.

In this embodiment it can be taken into account not only if, but also how a temperature threshold is exceeded. Different parameters can be considered to judge if data retention time is degraded.

In a first example the number of times a temperature threshold is exceeded is used to determine that data retention time is below a threshold. While a single occurrence of a high temperature may not be harmful a higher number thereof, for example ten occurrences, may indicate degraded data retention time.

Further, the frequency of high temperature events may be considered. Using this embodiment a single exceeding event per day, week, month or similar relatively long time interval may be regarded to be irrelevant. However, if the temperature exceeds the threshold a couple of time within an hour, quarter hour, minute or like relatively short time interval this should be considered to indicate degraded data retention time.

Still further not only the number and frequency may be taken into account, but also how much the temperature threshold is exceeded. For example, three temperatures exceeding the temperature threshold by one degree Celsius each may be considered to be irrelevant or at least less harmful than a single temperature measurement that exceeds the threshold by as much as ten or more degrees Celsius. Therefore according to an example embodiment the sum of $\Delta T_n$ over all measurements n is considered. In order to consider only temperatures exceeding the threshold $\Delta T_n$ is defined as the difference between measured temperature $T_n$ and temperature threshold $T_{thres}$ if $T_n > T_{thres}$ and defined as 0 if $T_n \leq T_{thres}$. In this manner the number of temperature events exceeding the threshold is considered together with the amount the threshold is exceeded.

It should be noted that these three decision parameters may be combined with one another, possibly with different thresholds for each. For example, a total number of ten temperatures exceeding a first threshold $T_{thres1}$ will cause a positive determination that data retention time is degraded below the desired value. At the same time a total number of three temperatures exceeding a second threshold $T_{thres2}$ (wherein $T_{thres2}$ may be, but is not necessarily equal to $T_{thres1}$) within the time interval of five minutes will also lead to a positive determination. Still further if $$\sum_{1}^{n} \Delta T_n$$

as defined above exceeds a third threshold (which may be different from both $T_{thres1}$ and $T_{thres2}$ because it is a sum of temperature differences) it will also be derived that data retention time has been degraded beyond tolerable values. That is, in this example a positive determination is made if any of these events occurs. Other combinations are possible as well.

According to an exemplary embodiment the method further comprises maintaining information about the number of write and erase operations performed on one or more locations of said non-volatile memory including said at least one location; wherein said temperature threshold $T_{thres}$ is dependent on the number of write and erase operations on a single location and/or a local or global peak number of write and erase operations on a plurality of locations and/or the average number of write and erase operations on a plurality of locations.

In non-volatile memories, for example of the NAND-type, the data retention time may be influenced not only by the temperature alone, but additionally also by the number of write/erase operations already performed on a particular memory cell or generally location. For example, a temperature of 85 C.° may not be alarming if the program/erase count of a particular location of the memory is 10, but may be alarming of it has a value of 1000. Therefore, according to this embodiment the temperature threshold is not constant, but takes into account the program/erase count, in such a manner that generally higher program/erase counts will decrease the temperature threshold. For example, the threshold may be lowered per write/erase operation by a small constant amount, i.e. linearly, or even by a progressively increasing value.

According to embodiments of the invention, for the temperature threshold one or more parameters can be taken into account, either alone or in any possible combination. These parameters include the number of write and erase operations on one or more single locations, local or global peaks of the number of write and erase operations on a plurality of locations, and an average value of the number of write and erase operations on a plurality of locations. To put it another way, according to this embodiment for each temperature measurement value $T_n$ the corresponding temperature threshold $T_{thres}{}^n$ is a function of the program/erase count P/E: $T_{thres}{}^n$(P/E). Generally $T_{thres}{}^n$ decreases with increasing P/E value(s).

Depending on $T_{thres}{}^n$ the same temperature may be considered not to exceed the threshold for low P/E values, while it is considered to exceed the threshold for higher P/E values.

A reason for taken into account the above mentioned different variations of the P/E count (e.g. local/global peak value(s), single location value(s), average value) is that the used wear levelling mechanism can play a role. For example, considering the wear levelling mechanism has a relatively poor efficiency then very high peak P/E values compared to the average P/E value may occur. In this case considering only the P/E count(s) of (a) single location(s) can achieve good results, as only the memory blocks with high P/E value will be refreshed.

However, if the wear levelling mechanism is instead rather efficient ΔP/E may be very low, e.g. all blocks being within 100 P/E cycles while the maximum specified value is around 5000, it might be disadvantageous to perform refresh only based on peak values. This could possibly lead to unjustified re-writing actions that may substantially decrease the remaining P/E cycles while not offering a corresponding increase in temperature-dependent data retention time. In this case it might therefore be better, if there is an indication that the temperature has been high for a long enough period, to consider the average P/E count for the temperature threshold instead. Then the assumption can be made that all blocks are in similar condition and it makes more sense to refresh all of them is ΔP/E is small enough.

Furthermore this embodiment allows providing a safety mechanism. If the P/E count of certain memory locations exceeds a safety limit these memory locations can be locked, i.e. set to read-only, or even be forbidden from any further use. Of course data will be relocated before locking such locations. According to another exemplary embodiment a location can be set to read-only status if and for as long as the temperature is considered too high, and be re-set to read/write status if the temperature has lowered below safe limits again.

According to an exemplary embodiment said re-writing comprises
  reading data stored in said at least one location of said non-volatile memory; and
  writing said data to a different location of said non-volatile memory.

This embodiment allows writing data that is considered to be endangered by degraded data retention time into another location of the non-volatile memory. Such an embodiment may take advantage of a property of many non-volatile memory types, namely that each location may only be written to after a previous erase operation (the first initial write may be done without preceding erase operation). Erase operations take time during which the memory is not ready for read or write operations, i.e. the latency of memory accesses is influenced by the required erase operation. However, erase operations may be done in the background while no other accesses are performed.

If due to the background erasing at least one other location of the memory large enough to receive the data to be relocated is already in an erased/programmable state, this embodiment is particularly advantageous, because the data can be relocated by performing only a single operation which is data write (wherein the mandatory read operation is not counted). The original location of the relocated data can then again be erased in the background, i.e. without performance loss with respect to access time of the memory.

This embodiment also can be used if no continuous erased/programmable location is available, but if the total amount of erased/programmable memory locations is sufficient for receiving the data to be relocated. This will still allow performing erase operations in the background, but it achieves this at the cost of increasing fragmentation of the data.

It should be noted that the term "re-writing" does not necessarily mean that a read operation is immediately followed by a writing operation. Further steps or operations can be performed between the read and the write operation, including but not limited to a buffering operation as explained later on. The time interval between these operations can be short, but can also be substantially longer, including but not limited to a time delay to allow the temperature to decrease below a safety limit.

According to an exemplary embodiment said different location is selected based on information about the number of write and erase operations performed on said different location.

In order to provide optimal wear-levelling of the non-volatile memory, the number of write and erase operations of locations of the memory should be considered when selecting a new memory location for relocating data. That is, locations having a lower number of write and erase operations will be favoured.

According to an exemplary embodiment said re-writing comprises
  buffering data stored in said at least one location of said non-volatile memory;
  erasing said at least one location; and
  re-writing said buffered data to said at least one erased location.

This embodiment is advantageous particularly in implementations where an additional buffer memory is available for buffering data to be relocated, for example a volatile memory like a DRAM memory or like. If the data to be relocated can not be simply relocated to another memory location—for example as the remaining free memory space is insufficient—it will be required to re-write the data to the same location again. Due to the properties of non-volatile memories this requires a preceding erase operation. During this erase operation the data thus have to be buffered. As the erase time is comparatively short, this may be accomplished by using an additional buffer memory, for example a DRAM memory found in many electronic devices.

It should be noted that the two previously described embodiments may be combined as well. For example, if the free memory space is insufficient to accommodate the complete data to be relocated, the free memory space may still be used to relocate a first part of the data to be relocated, while the remaining second part will be buffered and then be rewritten to its original location. In this manner the time lost due to required erase operations is at least minimized compared to a complete buffering, erasing and rewriting operation. That is, at least the memory amount connected to the first part of the data will not have to be erased immediately.

According to exemplary embodiments said data retention time threshold is a pre-defined and/or freely programmable threshold. For example the data retention time threshold can be implemented as a value that is initially pre-defined, and that can optionally be re-programmed during operation. The threshold value can also be freely programmable at all times, i.e. also initially.

According to a second aspect of the invention a computer program product is provided, comprising code sections for instructing a device to perform the method described above when said computer program product is running on said device. According to an exemplary embodiment said code sections are stored on a computer-readable medium.

According to a third aspect of the invention a module is provided, comprising
a non-volatile memory;
a data interface configured for accessing said non-volatile memory;
a temperature sensor configured for measuring the temperature of at least one location of said non-volatile memory;
a controller connected to said non-volatile memory and said temperature sensor, said controller being configured for determining if said temperature measurement indicates that the data retention time of data stored at said at least one location is reduced below a threshold and for re-writing said data to said non-volatile memory in response to a positive determination.

It should be noted that the term "memory module" in the context of the invention can refer to an external, i.e. removable memory module, but as well to an internal or embedded memory module that is not removable, but mounted within an electronic device.

According to an exemplary embodiment a positive determination is made if
said temperature exceeds a temperature threshold $T_{thres}$ a pre-determined number of times;
said temperature exceeds a temperature threshold $T_{thres}$ a pre-determined number of times per pre-determined time interval;
or
if $$\sum_{1}^{n} \Delta T_n$$

exceeds a pre-determined threshold;
wherein $$\begin{cases} \Delta T_n = T_n - T_{thres} & \text{if } T_n > T_{thres}; \\ \Delta T_n = 0 & \text{if } T_n \le T_{thres}; \end{cases} \text{ and}$$

wherein
n is an integer value indicating the number of temperature measurements;
$T_{thres}$ is a temperature threshold; and
$T_n$ is the temperature measured in the $n^{th}$ temperature measurement.

According to an exemplary embodiment
said controller is further configured for maintaining information about the number of write and erase operations performed on one or more locations of said non-volatile memory including said at least one location; and
said temperature threshold $T_{thres}$ is dependent on the number of write and erase operations on a single location and/or a local or global peak number of write and erase operations on a plurality of locations and/or the average number of write and erase operations on a plurality of locations.

According to an exemplary embodiment said re-writing comprises
reading data stored in said at least one location of said non-volatile memory; and
writing said data to a different location of said non-volatile memory.

According to an exemplary embodiment said controller is configured for selecting said different location based on information about the number of write and erase operations performed on said different location.

According to an exemplary embodiment said apparatus further comprises
a buffer interface configured to write data to and read data from a buffer memory; wherein said re-writing comprises
buffering data stored in said at least one location of said non-volatile memory in said buffer memory;
erasing said at least one location; and
re-writing said buffered data to said at least one erased location.

According to an exemplary embodiment said apparatus further comprises
a buffer memory connected to said buffer interface.

According to an exemplary embodiment said buffer memory is a volatile memory.

According to an exemplary embodiment said temperature sensor is implemented
in said non-volatile memory;
in said controller; or
in said module separate from said non-volatile memory and said controller.

For example, the temperature sensor can be implemented within the memory die, within the controller or inside the module but neither within memory die or controller.

Depending on the actual location of the temperature sensor it may be required to take into account an appropriate temperature offset. For example, a temperature sensor which forms part of the memory die may be considered to measure the temperature of the memory quite accurately, such that a low or even zero offset is required to obtain the "real" temperature of the memory from the temperature measurement. A temperature sensor in the controller or somewhere else in the memory module separate from the non-volatile memory and the controller, however, may provide a slightly offset temperature measurement, compared to the "real" memory temperature. In order to compensate for this, a corresponding corrective offset may be taken into account.

In other embodiments this could be compensated by corresponding adaptation of the temperature threshold. For example, if the "real" memory temperature is known to be offset by ~+5° C. compared to the measured temperature value, the temperature threshold could be lowered by a similar amount to compensate.

According to exemplary embodiments said data retention time threshold is a pre-defined and/or freely programmable threshold. The threshold value can for example be initially pre-defined or initially freely programmable, and optionally additionally freely re-programmable during operation.

According to a third aspect of the invention an apparatus is provided, comprising a module as described above, and a host controller configured for accessing said non-volatile memory via said data interface.

According to a fourth aspect of the invention an apparatus is provided, comprising
- means for measuring the temperature of at least one location of a non-volatile memory;
- means for determining if said temperature measurement indicates that the data retention time of data stored at said at least one location is reduced below a threshold; and
- means for re-writing said data to said non-volatile memory in response to a positive determination.

BRIEF DESCRIPTION OF THE DRAWINGS

The invention can be more fully understood by referring to the following detailed description of exemplary embodiments, when also referring to the drawings, which are provided in an exemplary manner only and are not intended to limit the invention to any particular embodiment illustrated therein. In the drawings

FIG. 5 is a schematic view of an embodiment of a memory controller of the invention;

FIG. 6 is a schematic view of an embodiment of a memory module of the invention;

DETAILED DESCRIPTION

Figure 1:
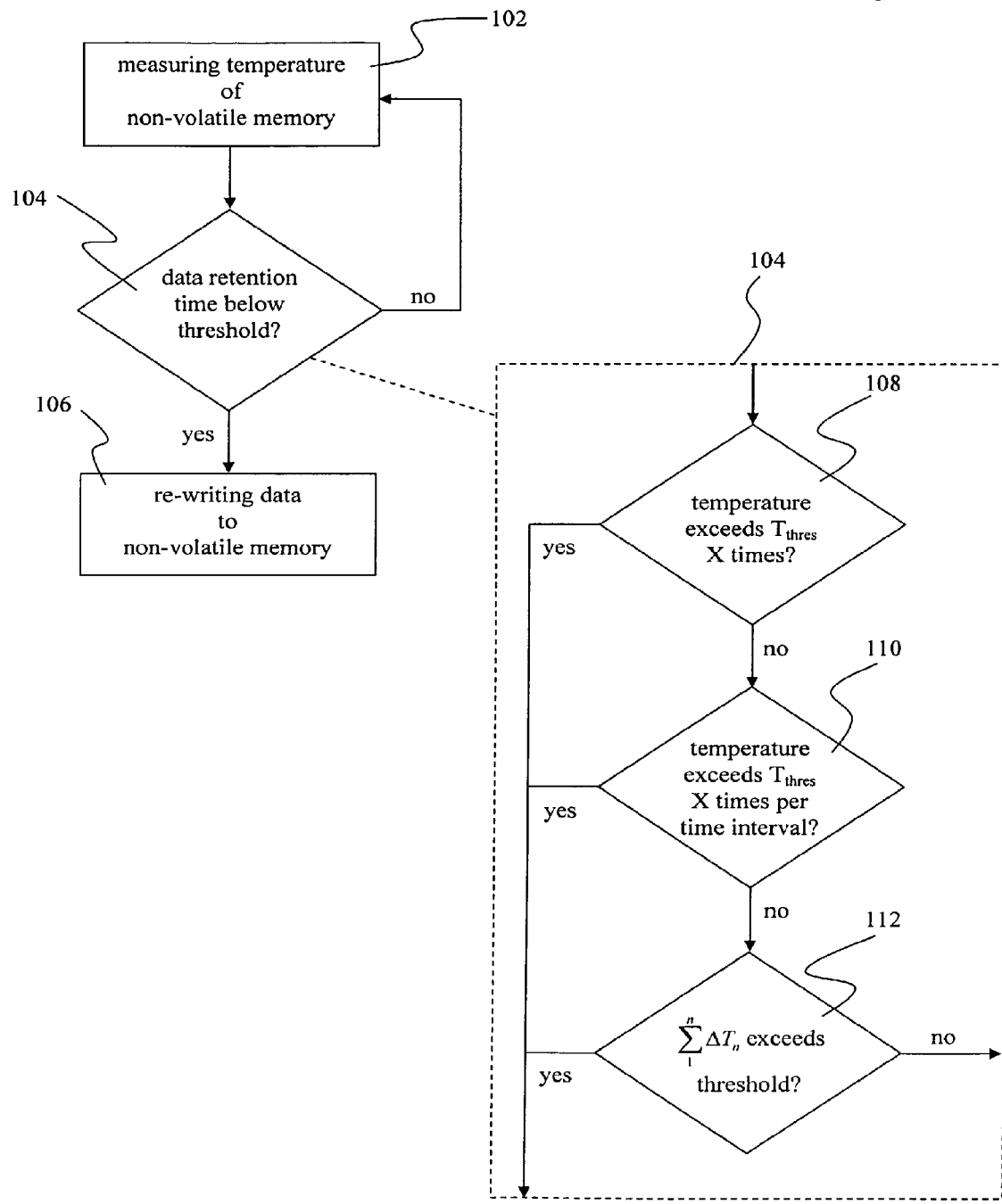
FIG. 1 is a flow diagram illustrating an embodiment of the method of the invention.

FIG. 1 illustrates an embodiment of the method of the invention in form of a flow diagram. In step 102 the temperature of a non-volatile memory is measured. It should be noted that the temperature of the whole memory, e.g. a flash memory module can be measured by a single value, but that also the temperatures of different regions or locations of the memory module can be measured as a plurality of values. In case more than one temperature value is measured for a non-volatile memory, only the location belonging to the measured temperature is checked for possible data corruption in the following steps. In case of only a single temperature value it is assumed that this temperature is valid for the whole memory.

In step 104 it is checked if the measured temperature indicates that the data retention time of the non-volatile memory is below a pre-determined threshold. If not, that is, if the data retention time is determined to be sufficient to ensure data integrity, the process is restarted in step 102. If the data retention time is considered to be degraded below acceptable values, the process is continued in step 106. In step 106 data stored on the non-volatile memory is rewritten in order to refresh it. It is to be noted that this step can be performed data-sensitive, i.e. only for actual user data stored on the non-volatile memory.

According to the invention there are different alternatives for performing this rewriting procedure of data (not illustrated in this figure). If there is sufficient un-used memory space available on the non-volatile memory to accommodate the data to be rewritten, then this data can be relocated in step 106 to another, un-used memory location. For memories like flash memory "un-used" is to be understood as erased but not yet programmed. This relocation procedure may involve that the data to be rewritten is fragmented, i.e. split up into two or more smaller parts to be written to separate locations of the memory. However, it is preferred that fragmentation is avoided or at least kept as low as possible. This will mean that data to be rewritten is preferably rewritten to a continuous available memory location, or at least be split up into as few parts as possible.

This alternative is preferred because it can avoid additional erase operations which increase the memory access latency. However, on the one hand this requires enough free memory space, and on the other hand it may cause fragmentation of the data.

In case of temperature measurement for two or more locations of the memory, the above described relocation should preferably be handled such that data is relocated to parts of the memory that have the lowest temperature, if possible. On the other hand it should of course be avoided as much as possible to relocate data to memory areas having a high temperature. Depending on the temperature of different memory areas it may even be advantageous to use the rewrite alternative described in the following part instead of the data relocation, if there are only memory areas having a higher temperature than the one currently holding the data to be relocated.

If there is not enough available memory space for accommodating the data to be rewritten, step 106 may involve buffering this data, erasing the memory location previously occupied thereby, and then rewriting the buffered data back to the now erased original location. This will require that sufficient buffer memory is available to buffer the data during the erase procedure. An artisan will acknowledge that the minimum required buffer space is determined by the size of the smallest erasable unit of the non-volatile memory. The data can so be buffered and rewritten in small portions one by one, while only the smallest possible part of the data to be rewritten is buffered at one time.

It should be noted that these two alternatives can be combined as well. Let's assume that there is some available memory space which is smaller than the complete size of the data to be rewritten. In this case it would be possible to relocate a portion of this data corresponding to the available memory space in a first stage according to the first alternative. The remaining portion of the data to be rewritten can then be buffered and rewritten in a second state according to the second alternative. In this combined manner the optimum compromise between minimized erase operations and latency can be achieved for memories that do not have enough available free space to enable single-step relocation of comparatively large amounts of data. However, it achieves this at the cost of possible data fragmentation.

FIG. 1 further illustrates three parameters for determining that data retention time has degraded in step 104, in the dashed box also referred to as 104. A first criterion 108 is a check that the measured temperature exceeds a threshold temperature $T_{thres}$ for a pre-determined (absolute) number of times X. In a simple embodiment the number X could be 1, in other embodiments 3 or more. In case the number X is exceeded by high temperature events the process continues in step 106 as described above.

A second criterion 110 is the frequency of high temperature events, i.e. the occurrence of a measured temperature above $T_{thres}$ within a certain time interval. For example, a single high temperature event within a week might be considered harmless, while three high temperature events within five minutes indicate that data retention time has degraded below acceptable values and requires action. In case the frequency is above a threshold the process also continues in step 106.

A third criterion 112 that could indicate degraded data retention time is the sum over $\Delta T_n$ temperatures exceeding the threshold. That is, for temperatures exceeding $T_{thres}$ the difference between $T_{thres}$ and the measured temperature $T_n$ is summed up. If this sum exceeds a predetermined threshold, the data retention time is considered to be below acceptable values, and the process continues in step 106. Using this formula not only the number of high temperature events is taken into account, but also by how much the temperature threshold is surpassed each time. In this manner a single event with a very high temperature, e.g. 20 C above the $T_{thres}$, could be handled the same as the occurrence of five high temperature events with a temperature of only 4 C above $T_{thres}$, as the sum is identical in these two cases: 1×20=5×4.

These three exemplary criteria can also be combined in any manner, or applied in parallel. For example the above described sum could also take into account the frequency or time-related distribution of high temperature events. In the above example a single occurrence of a temperature of $\Delta T=20$ C.° (i.e. in one base time interval) would then indicate a higher rate of data retention degradation than four occurrences of $\Delta T=5$ C.° (i.e. in four base time intervals), because the latter events have a wider distribution in time than the single high temperature event.

Figure 2:
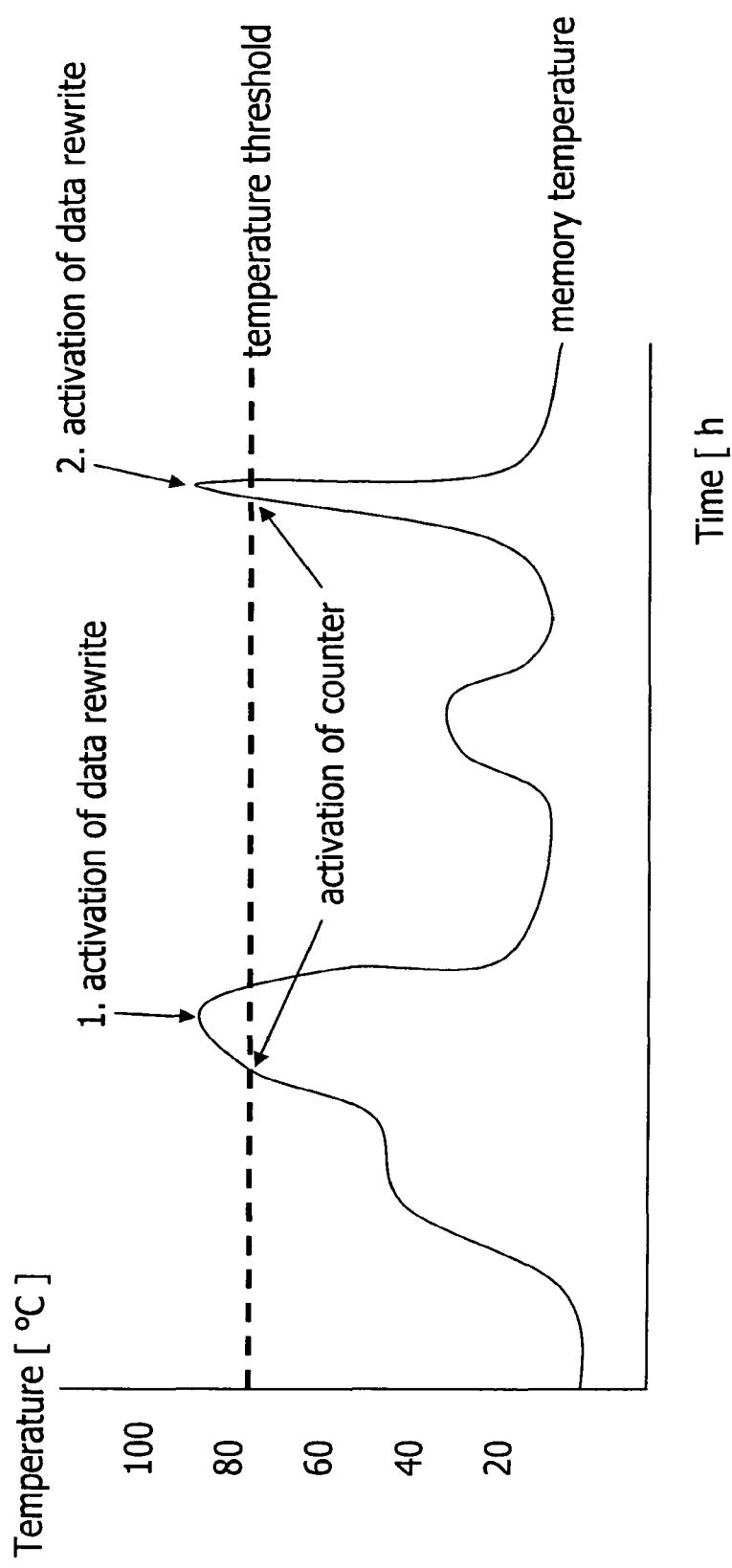
FIG. 2 illustrates criteria for determining a degradation of data retention time.

Some of the above mentioned criteria are illustrated in FIG. 2. In the diagram the measured temperature of the memory is shown over time. A temperature threshold of 75 C.° is also shown as a dashed line. It is to be noted that this threshold is shown here as a constant threshold, while other embodiments may have a variable threshold, e.g. dependent on the program/erase or write/erase count. In this example a first activation of data rewrite takes place upon exceeding of the temperature threshold. Also a counter is activated, which is provided to count the number of times the temperature threshold is exceeded. A second activation of data rewrite takes place upon exceeding of the temperature threshold for the second time, while the counter is incremented by one. In an alternative embodiment the counter would allow activating data rewrite not already at the first high temperature event as shown here, but at the second (or some later) event.

Figure 3:
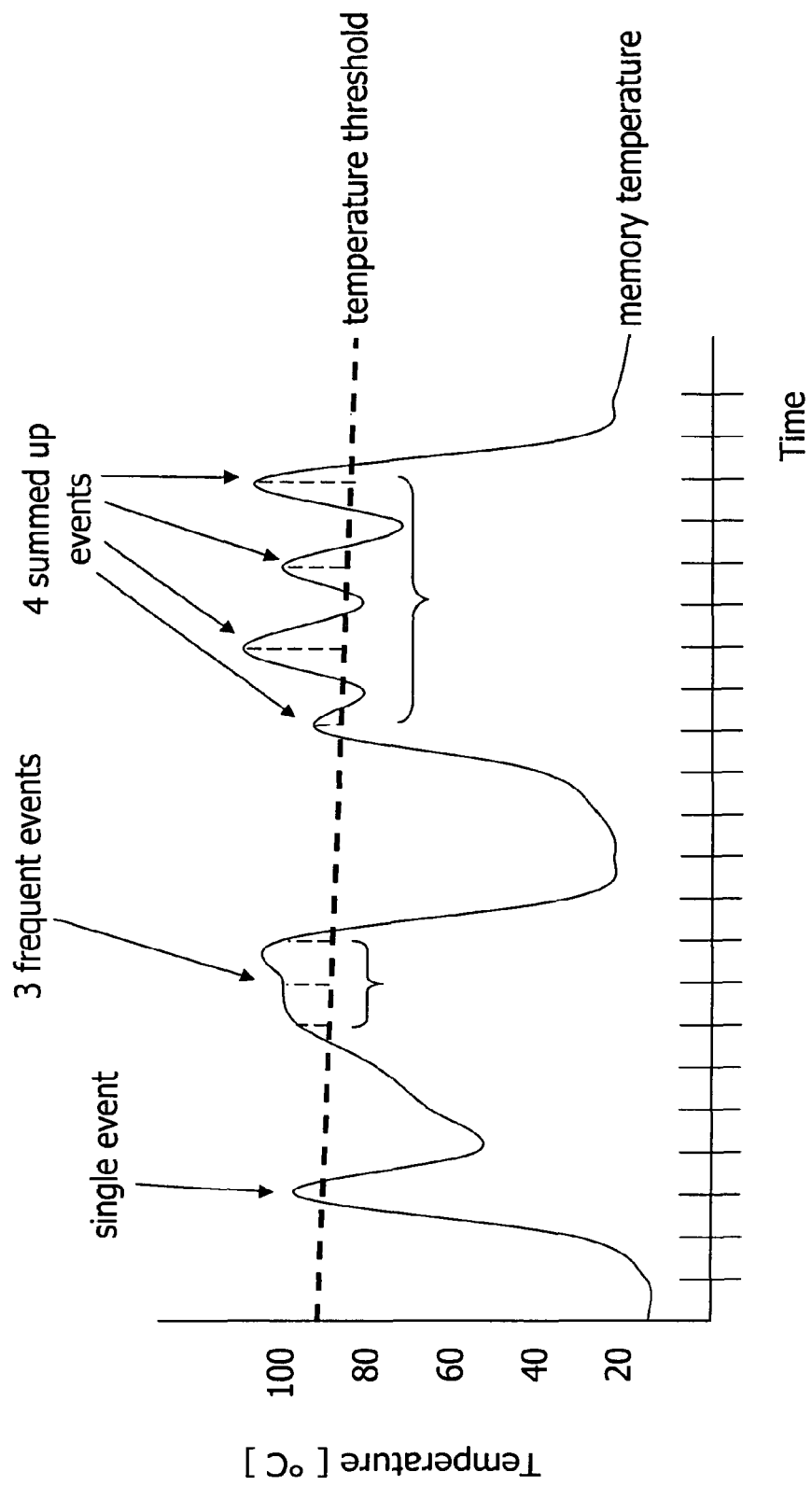
FIG. 3 illustrates still further criteria for determining a degradation of data retention time.

Still other criteria for determined data retention time degradation are illustrated in FIG. 3. Again the memory temperature is shown over time. It is to be noted that there are only discrete temperature measurement points, while the temperature curve is shown as a continuous curve to improve intelligibility. Also, different from FIG. 3 the dashed threshold line is not at a constant value, but represents a decreasing threshold starting from about 90 C.° and reaching about 80 C.° at the right of the diagram. This may for example result from a dependency of the threshold from the program/erase count which is assumed to increase over time.

In the left of the diagram a single event of a measured temperature exceeding the threshold is shown. Depending on the actual implementation this may lead to an immediate data rewrite action, or may be recorded as a threshold exceeding event for later action, e.g. taking data rewrite action upon the third such event.

In the middle of the diagram three very frequent events of temperature measurements exceeding threshold are shown. That is, at three successive measurement points the temperature is considered too high. In an embodiment this could lead to immediate data rewrite action, as this is a strong indication for degraded data retention time. If these three events had not occurred successively or in a comparatively short time interval, but rather distributed over a week or month, this would not be a strong indication of data retention degradation and thus not necessarily require immediate action. In other exemplary embodiments the re-writing can also be performed in a delayed fashion after the temperature has settled below safety limits again.

Finally, in the right of the diagram the criterion of the summing up of high temperature events is illustrated. This criterion takes into account the number as well as the amount a temperature exceeds the threshold. For example, while each of the four temperature peaks might not be considered to indicate harmful data retention time degradation by its own, the summing up of these events as described above may very well indicate critical data retention time degradation requiring immediate action.

The sum could also consider the time interval of the sum. For example, if the four peaks were not measured in a time interval of seven base time units as shown here (each peak being separated from the successive one by one temperature value below the threshold), but during a much larger time interval of e.g. fifty time units (i.e. each peak being separated from the next one by a much longer time below the threshold), this could indicate a lower data retention time degradation and be handled accordingly.

Figure 4:
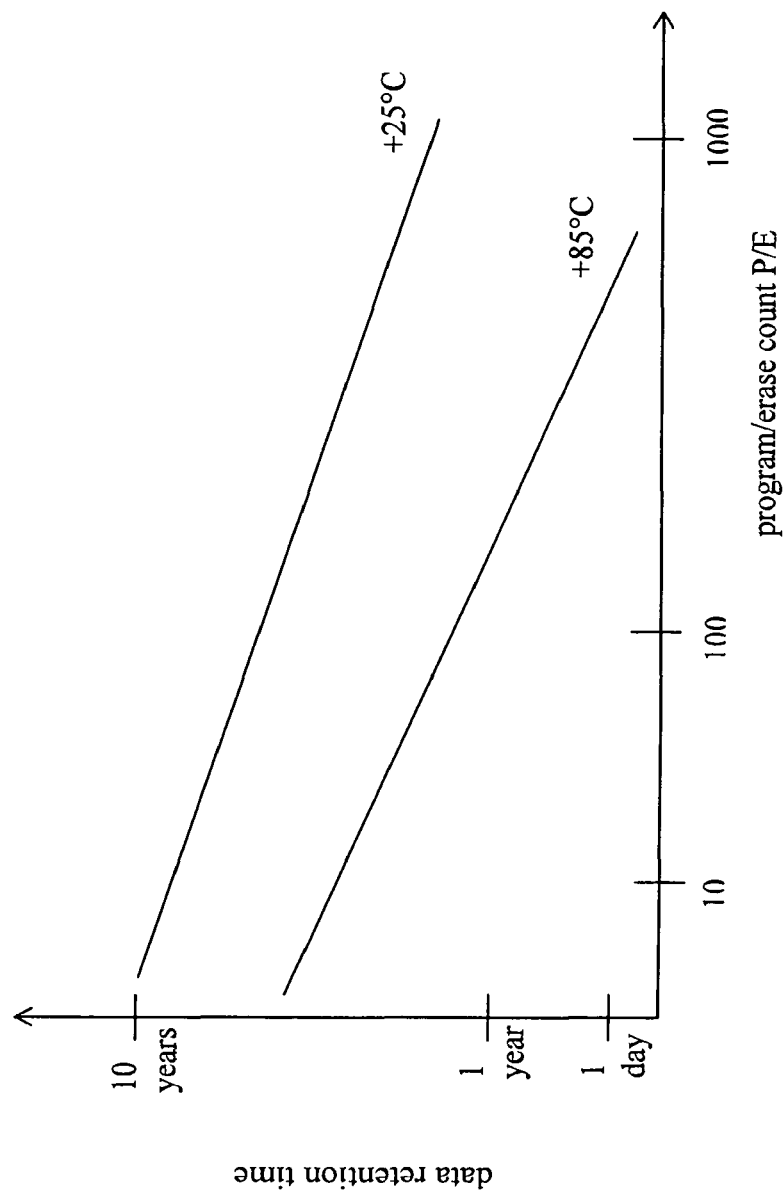
FIG. 4 is a diagram illustrating the qualitative relation of temperature and data retention time.

FIG. 4 illustrates that the data retention time does not necessarily depend only on the temperature of a memory, but may also depend on the program/erase count thereof. That is, for a particular memory area the data retention time at a temperature of +25 C.° may initially be as high as 10 years. However, this data retention time will degrade even at constant temperature with every further program/erase operation. After 1000 program/erase operations it might have reached a value of about 2 years already. This is illustrated by the upper line in this diagram, referred to as "+25 C.°".

Another line referred to "+85 C.°" illustrates the behaviour of the data retention time at a (assumed to be constant) temperature of 85 C.°. The data retention time does not only start at a smaller initial value, but also shows a higher degree of degradation with increasing program/erase count.

It is to be noted that this linear behaviour of the data retention time assumes a substantially constant temperature. Therefore, in practice where the temperature will have larger non-linear variations the data retention time will behave accordingly, i.e. non-linear as well. Also, the degradation of the data retention time must not be linear with linear progression of the program/erase count, but may be progressive or have another more complex non-linear dependency. Therefore this diagram shall only illustrate a qualitative gradient of the data retention time as a function of temperature and program/erase count.

What is important is that the data retention time will be degraded by both factors, i.e. temperature and program/erase count, independently. Thus the temperature threshold which is related to the data retention time is not a constant threshold, but depends on the program/erase count and the temperature. To put it another way, while a temperature of 75 C.° may not be considered critical at a low program/erase count, a temperature of 70 C.° might be considered to be very critical at a substantially higher program/erase count.

Thus the temperature threshold $T_{thres}$ is a function of both temperature and program/erase count: $T_{thres}(T_n, P/E)$. This also means that the threshold $T_{thres}$ may be different for different locations or areas of the non-volatile memory, depending on the respective temperature and program/erase count taken into account therefor. For example, regions on the memory with lower temperature and/or program/erase count may so have a higher temperature threshold than regions with higher temperature and/or program/erase count.

It should be noted that, according to exemplary embodiments, the P/E count taken into account for determining the temperature threshold of a particular memory location may include but is not limited to the P/E count of that particular memory location itself, but can be e.g. the P/E count of one or more single location(s) of the non-volatile memory, a local or global peak P/E value of a plurality of memory locations or an average P/E value of a plurality of memory locations. Combinations of these parameters can also be taken into account.

It is to be noted that temperature and program/erase count may be measured in different magnitudes of diversification. For example, the temperature could be measured for a complete non-volatile memory, while the program/erase count could be measured for each erasable unit. Or the temperature could be measured for a plurality of memory regions, while as the program/erase count only the highest program/erase count of all erasable units is considered. Further combination possibilities should be apparent to an artisan.

In FIG. 5 an embodiment of a memory controller according to the invention is shown. The memory controller 2 is adapted for read/write/erase access to a non-volatile memory (not shown), in the example shown here via a data interface 4. It further comprises a temperature interface 6 adapted for receiving information about the temperature of the non-volatile memory. For example a temperature sensor can provide this information, the sensor being integrated into the non-volatile memory or being an external temperature sensor separate from the memory but capable of measuring the temperature thereof. The memory controller 2 operates as described above, i.e. it performs data rewrite operations via the data interface 4 if the temperature information received via the temperature interface 6 indicates harmful degradation of the data retention time of data stored in the non-volatile memory.

In FIG. 6 an embodiment of a memory module according to the invention is shown. The memory module 10 comprises a memory controller 2 as shown in FIG. 5 (e.g., with a data interface 4 and a temperature interface 6), wherein the function of the memory controller 2 is as described above. Furthermore the memory module 10 includes a non-volatile memory 12, e.g. a flash memory of the NAND-type. The non-volatile memory 12 is connected to the memory controller 2. A temperature sensor 8 is provided to measure the temperature of the non-volatile memory 12, and is connected to the memory controller. The temperature sensor 8 may be implemented in the non-volatile memory 12, in the memory controller 2 or in the memory module 10 separate from the non-volatile memory 12 and the memory controller 2. In some embodiments, the memory module 10 may include a buffer memory 22 and a buffer interface 24 associated with the memory controller 2. The buffer interface 24 may write the data to and read the data from the buffer memory 22.

The temperature sensor 8 can be integrated into the memory die (e.g. NAND die), the memory package (e.g. NAND) or the memory module (e.g. eMMC). In alternative embodiments it can be a discrete/integrated solution outside of the memory. The temperature sensor 8 can be of any type of temperature sensor, including but not limited to diode, NTC (negative temperature coefficient) resistor, digital temperature sensor, transistor etc.

Figure 7:
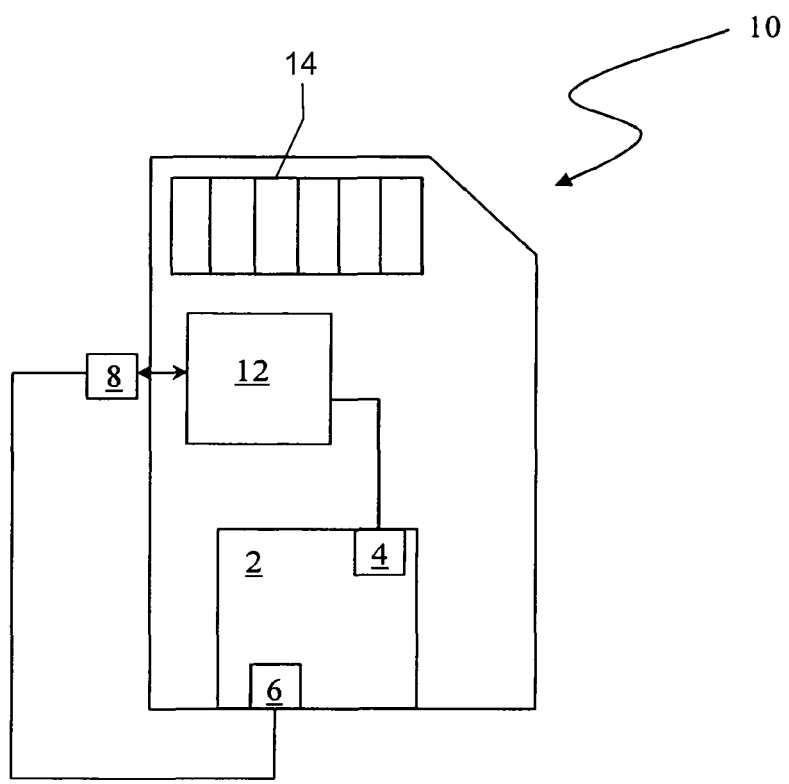
FIG. 7 is a schematic view of an other embodiment of a memory module of the invention.

FIG. 7 shows a further embodiment of a memory module 10 according to the invention. The memory module 10 is similar to the one depicted in FIG. 6, however, the temperature sensor 8 is not integrated in the memory module 10. The temperature sensor 8 is an external sensor configured for measuring the temperature of the non-volatile memory 12 of the memory module 10. Accordingly the temperature interface of the memory controller 2 has an external input that can connect to the external temperature sensor 8. For example the temperature sensor 8 could be part of a slot for receiving the memory module 10, in an electronic device like a mobile phone, computer or like. In this manner the temperature sensor 8 could be provided e.g. in the system board (like mobile phone baseband). Again, the temperature sensor can be any type (diode, NTC resistor, digital temperature sensor, transistor, contactless infra-red sensor etc.).

Figure 8:
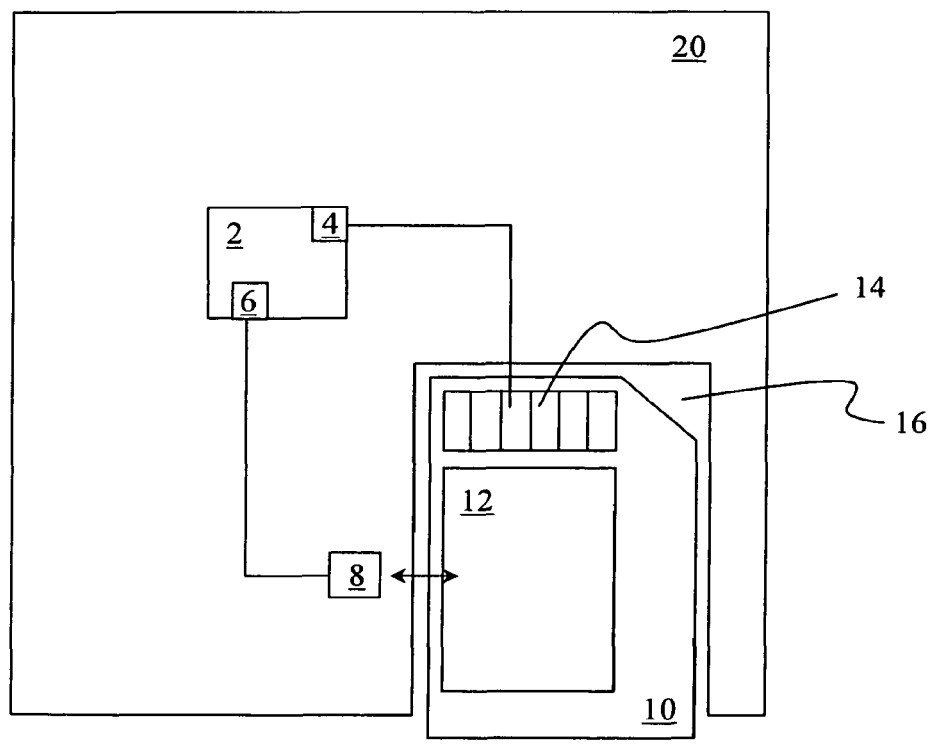
FIG. 8 is a schematic view of an embodiment of an electronic device of the invention.

FIG. 8 shows an embodiment of an electronic device 20 according to the invention. The electronic device 20 may comprise a slot 16 for receiving a removable memory module 10 including a non-volatile memory 12 and a data interface 14. Alternatively, a memory module 10 including a non-volatile memory 12 and a data interface 14 may be embedded into the electronic device 20. The electronic device 20 comprises a memory controller as e.g. depicted in FIG. 5, comprising a data interface 4 and a temperature interface 8. The data interface 4 is adapted to communicate with the corresponding data interface 14 of the memory module 10. The temperature interface 6 is adapted to connect to the temperature sensor 8, which is adapted for measuring the temperature of the non-volatile memory 12 in the memory module 10. The memory controller 2 operates as described above.

An advantage of this embodiment is that with this electronic device 20 a conventional memory module 10, e.g. an SD (Secure Digital) card, compact flash card or any other type of non-volatile memory card or module, memory package type, package/die stack combination etc. can be used, while still being able to ensure data integrity based on the inventive method for temperature-based data refresh. No provisions have to be made in the conventional memory module to allow the invention to work.

The invention provides an advantageous way of ensuring data integrity in non-volatile memories, while at the same time keeping the program/erase (P/E) count and thus the wear of the memory at the lowest possible value. The data refreshing is done only when needed at high temperatures to keep stored data intact and save P/E cycles over lifetime. The refreshing is done by re-writing data to a new position inside of the memory space, or by re-writing the data to the initial position after a preceding erase operation, or by combining both alternatives.

By using (a) temperature sensor(s) and predefined critical temperature limit(s) the need for the data refresh can be controlled. In cases where the temperature sensor(s) indicate(s) too high temperature for the memory (exceeding predefined temperature limit) the automatic memory refresh function may be activated. The refresh function is only performed when needed.

The predefined temperature limit can be a fixed temperature or set of limit temperatures with different functions. The temperature limit(s) can depend on the program/erase count of memory regions.

Memory refresh functions can be controlled internally by the memory/memory module or control can be done by an entity external to the memory device, for example by a mobile phone or other electronic device the memory is connected to or integrated therein.

The time above critical temperature can have different functions. For example a short time above critical temperature can be stored and refreshing is done when several times of exceeding are registered or a total time above the limit is exceeded. If an occurrence of a temperature above the critical temperature is considered long enough, the refreshing can be done several times during the exceeding time. Temperature limits, refresh rates and exceeding time can be optimized depending on the needs and technology. Different additional parameters affecting the refresh timing/rules could also be in the memory/memory module itself (like program/erase cycle count) or in the system (like total usage time of the device).

For a fully occupied memory also external memory can be used as a temporary storage during refreshing or space for swapping can be reserved within the memory device for this purpose. The temporary storage space or buffer memory can be a volatile memory like DRAM.

While the foregoing specification is provided to draw attention to those features of the invention believed to be of particular importance it should be understood that protection is claimed with respect to any patentable feature or combination of features referred to and/or shown in the drawings, whether or not particular emphasis has been put thereon. It should be appreciated that those skilled in the art, upon consideration of the present disclosure, may make modifications and/or improvements on the method and device hereof and yet remain within the scope and spirit of the invention as set forth in the appended claims.

The invention claimed is:

1. A method comprising:
   determining a temperature threshold based at least in part on a number of program-erase (P/E) cycles performed on at least one location of a non-volatile memory;
   measuring one or more temperatures associated with the at least one location of the non-volatile memory;
   determining whether at least one measured temperature of the one or more measured temperatures meets or exceeds the temperature threshold; and
   re-writing data stored at the at least one location to the non-volatile memory in response to determining that the at least one measured temperature meets or exceeds the temperature threshold.

2. The method according to claim 1, further comprising:
   tracking a number of P/E cycles performed on individual locations of the non-volatile memory;
   wherein the temperature threshold is dependent on at least one of:
   the number of P/E cycles performed on the at least one location,
   a local or a global peak number of P/E cycles performed on a plurality of locations, or
   an average number of P/E cycles performed on the plurality of locations.

3. The method according to claim 1, wherein the re-writing comprises:
   reading the data stored in the at least one location of the non-volatile memory; and
   writing the data to a different location of the non-volatile memory.

4. The method according to claim 3, wherein the different location is selected based on information about a number of P/E cycles performed on the different location.

5. The method according to claim 1, wherein the re-writing comprises:
   buffering the data stored in the at least one location of the non-volatile memory;
   erasing the at least one location; and
   rewriting the buffered data to the at least one erased location.

6. A module comprising
   a non-volatile memory;
   a data interface configured to access the non-volatile memory;
   at least one temperature sensor configured to measure one or more temperatures associated with at least one location of the non-volatile memory; and
   a controller connected to the non-volatile memory and the at least one temperature sensor, the controller being configured to:
   define a temperature threshold related to the at least one location of the non-volatile memory based at least in part on a number of program-erase (P/E) cycles performed on the at least one location;
   determine whether the one or more measured temperatures meet or exceed the temperature threshold; and
   re-write data to the non-volatile memory in response to determining that the one or more measured temperatures meet or exceed the temperature threshold.

7. The module according to claim 6, wherein:
   the controller is further configured to track a number of P/E cycles performed on individual locations of the non-volatile memory; and
   the temperature threshold is dependent on one or more of:
   the number of P/E cycles performed on the at least one location,
   a local or a global peak number of P/E cycles performed on a plurality of locations, or
   an average number of P/E cycles performed on the plurality of locations.

8. The module according to claim 6, wherein the re-writing comprises:
   reading the data stored in the at least one location of the non-volatile memory; and
   writing the data to a different location of the non-volatile memory.

9. The module according to claim 8, wherein the controller is configured to select the different location based on information about a number of P/E cycles performed on the different location.

10. The module according to claim 6, further comprising:
    a buffer interface configured to write the data to and read the data from a buffer memory;
    wherein the re-writing comprises:
    buffering the data stored in the at least one location of the non-volatile memory in the buffer memory;
    erasing the at least one location; and
    re-writing the buffered data to the at least one erased location.

11. The module according to claim 10, wherein the buffer memory is connected to the buffer interface.

12. The module according to claim 11, wherein the buffer memory is a volatile memory.

13. The module according to claim 6, wherein the temperature sensor is implemented:
    in the non-volatile memory;
    in the controller; or
    in the module separate from the non-volatile memory and the controller.

14. An apparatus, comprising the module according to claim 6, and a host controller configured to access the non-volatile memory via a data interface.

15. The method according to claim 1, wherein the temperature threshold decreases as the number of P/E cycles increases.

16. The method according to claim 1, further comprising:
    calculating an average temperature based on the one or more measured temperatures;
    determining if the average temperature meets or exceeds the temperature threshold; and re-writing the data stored at the at least one location to the non-volatile memory in response to determining that the average temperature meets or exceeds the temperature threshold.

17. The module according to claim 6, wherein the temperature threshold decreases as the number of P/E cycles increases.

18. The module according to claim 6, wherein the controller is further configured to re-write the data to the non-volatile memory in response to determining that the one or more measured temperatures meet or exceed the temperature threshold per time interval.

19. The module according to claim 6, wherein the controller is further configured to re-write the data to the non-volatile memory in response to determining that a sum of differences between the one or more measured temperatures and the temperature threshold meets or exceeds a predetermined value.

* * * * *